US006621126B2

(12) United States Patent
Russ (10) Patent No.: US 6,621,126 B2
(45) Date of Patent: Sep. 16, 2003

(54) MULTIFINGER SILICON CONTROLLED RECTIFIER STRUCTURE FOR ELECTROSTATIC DISCHARGE PROTECTION

(75) Inventor: Christian C. Russ, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/974,011

(22) Filed: Oct. 10, 2001

(65) Prior Publication Data

US 2002/0041007 A1 Apr. 11, 2002

Related U.S. Application Data

(60) Provisional application No. 60/239,203, filed on Oct. 10, 2000.

(51) Int. Cl.$^7$ .............................................. H01L 23/62
(52) U.S. Cl. ................... 257/355; 257/173; 257/162
(58) Field of Search ................................. 257/173, 162, 257/146, 141, 355

(56) References Cited

U.S. PATENT DOCUMENTS 5,880,488 A * 3/1999 Yu ............................. 257/111
5,895,940 A * 4/1999 Kim ........................... 257/173

* cited by examiner

Primary Examiner—Jerome Jackson
(74) Attorney, Agent, or Firm—William J. Burke (57) ABSTRACT

An electrostatic discharge (ESD) protection circuit including a silicon controlled rectifier having a plurality of SCR fingers. Each SCR finger includes at least one interspersed high-doped first region formed within a first lightly doped region. At least one interspersed high-doped second region are formed within a second lightly doped region, where the first and second lightly doped regions are adjacent one another. At least one first trigger-tap is coupled to the second lightly doped region. Additionally, at least one first low-ohmic connection is respectively coupled between the at least one first trigger tap of each SCR finger.

24 Claims, 5 Drawing Sheets

MULTIFINGER SILICON CONTROLLED RECTIFIER STRUCTURE FOR ELECTROSTATIC DISCHARGE PROTECTION

CROSS REFERENCES

This patent application claims the benefit of U.S. Provisional Application, Ser. No. 60/239,203, filed Oct. 10, 2000, the contents of which are incorporated by reference herein.

FIELD OF THE INVENTION

This invention generally relates to the field of electrostatic discharge (ESD) protection circuitry and, more specifically, improvements for silicon controlled rectifier (SCR) structures in the protection circuitry of an integrated circuit (IC).

BACKGROUND OF THE INVENTION

Integrated circuits (IC's) and other semiconductor devices are extremely sensitive to the high voltages that may be generated by contact with an electrostatic discharge (ESD) event. As such, ESD protection circuitry is essential for integrated circuits. An ESD event commonly results from the discharge of a high voltage potential (typically, several kilovolts) and leads to pulses of high current (a few amperes) of a short duration (typically, 100 nanoseconds). An ESD event is generated within an IC, illustratively, by human contact with the leads of the IC or by electrically charged machinery being discharged in other leads of an IC. During installation of integrated circuits into products, these electrostatic discharges may destroy the IC's and thus require expensive repairs on the products, which could have been avoided by providing a mechanism for dissipation of the electrostatic discharge to which the IC may have been subjected.

Figure 1:
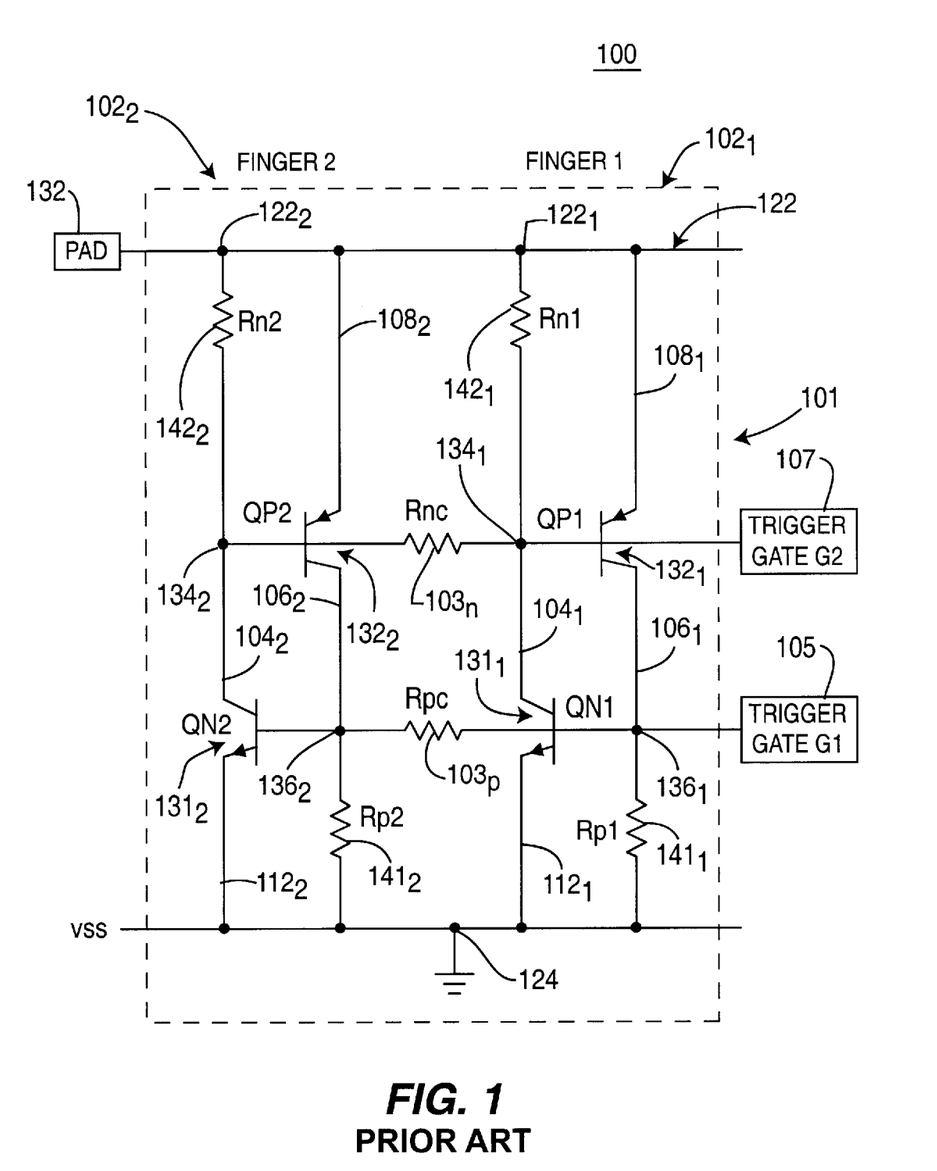
FIG. 1 depicts a schematic diagram of a prior art multi-fingered SCR included within an integrated circuit to provide ESD protection.

FIG. 1 depicts a schematic diagram of a prior art multi-fingered SCR ESD protection device 101, which serves as protection circuitry for an integrated circuit (IC) 100. As the distances between the pads (i.e., pad pitches) become smaller the ESD protection circuitry has been provided with multiple SCR fingers. An illustrative prior art integrated circuit 100 includes a SCR protection circuit 101 having multiple SCR fingers, and is illustratively depicted in FIG. 1 having two SCR "fingers" $102_1$ and $102_2$. Generally, prior to an ESD event, the SCR fingers are in a nonconductive state. Once the high voltage of an ESD event is encountered, the SCR fingers then change to a conductive state to shunt the current to ground. Each of the SCR fingers maintains this conductive state until the voltage is discharged to a safe level.

In particular, the SCR protection circuit 101 is connected from a pad 132 to ground 124. The pad 132 is also connected to the protected circuitry of the IC, optionally through a current limiting resistor $R_L$ (not shown). The SCR protection circuit 101 comprises a trigger device 105 (discussed further below), a first SCR $102_1$ (i.e., "first finger"), and a second SCR $102_2$ (i.e., "second finger"). The first SCR $102_1$ further comprises a NPN transistor QN1 $131_1$ and a PNP transistor QP1 $132_1$. In particular, the SCR protection device 101 includes an anode 122, which is connected to the pad 132 and to one side of a resistor $R_{n1}$ 142. The resistor $R_{n1}$ 142 represents the resistance of the N-well, which is seen at the base of the PNP transistor QP1 $132_1$ of the SCR $102_1$, which is discussed in further detail below. Additionally, the anode 122 is coupled to an emitter $108_1$ of the PNP transistor QP1 $132_1$, which is parallel to the N-well resistance $R_{n1}$ $142_1$.

A first node $134_1$ includes the base of the PNP transistor QP1 $132_1$, the other side of the resistor $R_{n1}$ $142_1$, and the collector $104_1$ of the NPN transistor QN1 $131_1$. A second node $136_1$ includes the collector $106_1$ of the PNP transistor QP1 $132_1$, the base of the NPN transistor QN1 $131_1$, and connects to one side of a resistor $R_{p1}$ $141_1$. The resistor $R_{p1}$ 141 represents the resistance of the P-well, which is seen at the base of the NPN transistor QN1 of the SCR $102_1$ and is discussed in further detail below. The other side of resistor $R_{p1}$ $141_1$ is connected to a third node 124, which is grounded and serves as the cathode of the SCR $102_1$. Furthermore, the emitter $112_1$ of the NPN transistor QN1 $131_1$ is also connected to the grounded third node 124.

A second SCR $102_2$ is formed exactly in the same manner as described with regard to the first SCR $102_1$. In particular, an emitter $108_2$ of a second PNP transistor QP2 $132_2$ is coupled to the anode 122, which is common to all of the multi-finger SCR's 102 and the pad 132. Furthermore, an emitter $112_2$ of a second NPN transistor QN2 $131_2$ is coupled to the cathode 124, which is common to all of the multi-finger SCR's 102 and ground. In addition, the two fingers $102_1$ and $102_2$ of the multi-finger SCR protection circuit 101 are coupled together by a common P-substrate and shared N-well regions therein. That is, the bases of the first and second NPN transistors QN1 $131_1$ and QN2 $131_2$ are coupled via a P-well coupling resistance $R_{pc}$ $103_p$. Similarly, the bases of the first and second PNP transistors QP1 $132_1$ and QP2 $132_2$ are coupled via a N-well coupling resistance $R_{nc}$ $103_n$. The coupling resistances $R_{pc}$ and $R_{nc}$ typically have high resistance values in the range of 100 to 2000 Ohms.

A single triggering device providing a positive trigger current to the trigger gate 105 has been used to turn on all of the SCR fingers 102. Alternatively, a single trigger device providing a negative trigger current to the trigger gate 107 may be used. It has been observed however, that providing the trigger current to the trigger gate 105 (or 107) has not been sufficient to trigger all of the SCR fingers 102 as is discussed below.

In operation, each protective multi-finger SCR circuit 102, which illustratively comprise the NPN and PNP transistors QN1 $131_1$ and QP1 $132_1$, will not conduct current between the anode 122 and the grounded cathode 124. That is, the SCR fingers 102 are turned off, since there is no high voltage (e.g., ESD voltage) applied to the SCR 102, but only the regular signal voltage of the functional parts of the IC. Once an ESD event occurs at the pad 132, a high voltage potential appears on the anode 122. A triggering device senses the high voltage potential and provides a trigger current to the trigger gate 105 and causes the base potential of the NPN transistor QN1 $131_1$ to rise, which subsequently turns on the NPN transistor QN1 $131_1$. Furthermore, the collector of the NPN transistor QN1 $131_1$ is coupled to the base of the PNP transistor QP1 $132_1$, which turns on the PNP transistor QP1 $132_1$.

As such, once the NPN transistor QN1 $131_1$ is turned on, the collector $104_1$ provides the base current to the PNP transistor QP1 $132_1$. Therefore, the base current of the PNP transistor QN2 $132_1$ is greater than the base current of the NPN transistor QN1 $131_1$. Moreover, the current gain of the PNP transistor QP1 $132_1$ is realized as the QP1 $132_1$ collector current, which is then fed back to the base of the NPN transistor QN1 $131_1$, thereby amplifying the base current of the NPN transistor QN1 $131_1$. Amplification of the base currents in the SCR 102 progressively continues to increase in a feedback loop between both transistors QN1 $131_1$ and QP1 $132_1$. Therefore, the conduction in a turned on SCR is also called a "regenerative process".

The SCR $102_1$ becomes highly conductive and sustains (i.e., holds) the current flow with a very small voltage drop (i.e., holding voltage) between the anode and cathode (typically, 1–2 V). Accordingly, once the SCR $102_1$ is turned on, the current from the ESD event passes from anode 122 to the grounded cathode 124. Once the ESD event has been discharged from the anode 122 to the cathode 124, the SCR 102 turns off because it cannot sustain its regenerative conduction mode.

There is usually a large voltage difference between the triggering point and holding point. One problem that has been observed is that the multiple SCR fingers 102 do not always trigger. That is, even though the first SCR finger $102_1$ may trigger, the other SCR fingers (e.g., SCR $102_2$) may not trigger because almost the entire triggering voltage quickly collapses, which fails to enable the other SCR fingers (e.g., SCR $102_2$) to reach their trigger voltages. Also the coupling through the relatively high-ohmic resistors Rnc and Rpc is too weak to turn on the other finger(s). In particular, a typical triggering voltage (depending on a trigger device connected to the trigger gate) is in a range of 7–10 volts, while the holding voltage for an SCR is in a range of 1 to 2 volts. If the first SCR finger $102_1$ triggers at 7–10 volts and then drops to the holding voltage of 1 to 2 volts, then there is not enough voltage to trigger the other SCR fingers 102. Thus, when the SCR fingers 102 carry large ESD currents, the voltage differences may lead to non-uniform current distribution and premature failure of the SCR fingers 102 and, ultimately, the IC 100 itself.

Such failure to trigger all of the multiple SCR fingers in an ESD protection device is especially prominent in epitaxial technologies. Specifically, wafers with an epitaxially grown layer of low-doped p material have a very low substrate resistance due to the high-doped p-region underneath the p-epitaxial layer. The objective of epitaxial wafers is to have exceptionally good coupling of the substrate to the ground potential. However, the low substrate resistance makes the triggering of the SCR fingers in an ESD protection circuit difficult. The very good coupling of the substrate to the ground potential impedes the current to flow to the other SCR fingers 102, such that only the first SCR finger $102_1$ will trigger, which may result in the remaining portion of the protection circuit 101 from not protecting the IC 100.

Therefore, there is a need in the art for a multi-fingered SCR protection device having a reliable triggering mechanism.

SUMMARY OF INVENTION

The disadvantages heretofore associated with the prior art are overcome by the present invention of an electrostatic discharge (ESD) protection circuit including a silicon controlled rectifier (SCR) having a plurality of SCR fingers. Each SCR finger includes at least one interspersed high-doped first region formed within a first lightly doped region.

At least one interspersed high-doped second region are formed within a second lightly doped region, where the first and second lightly doped regions are adjacent one another. At least one first trigger-tap is coupled to the second lightly doped region. Additionally, at least one first low-ohmic connection is respectively coupled between the at least one first trigger tap of each SCR finger.

BRIEF DESCRIPTION OF THE DRAWINGS

To facilitate understanding, identical reference numerals have been used, where possible, to designate identical elements that are common to the figures.

DETAILED DESCRIPTION OF THE INVENTION

The present invention can be practiced in conjunction with integrated circuit fabrication techniques currently used in the art, and only so much of the commonly practiced process steps are included as are necessary for an understanding of the present invention. The figures representing cross-sections and layouts of portions of an IC during fabrication are not drawn to scale, but instead are drawn so as to illustrate the important features of the invention. The present invention is described with reference to CMOS devices. However, those of ordinary skill in the art will appreciate that selecting different dopant types and adjusting concentrations allows the invention to be applied to bipolar and other processes that are susceptible to damage caused by ESD.

Figure 2:
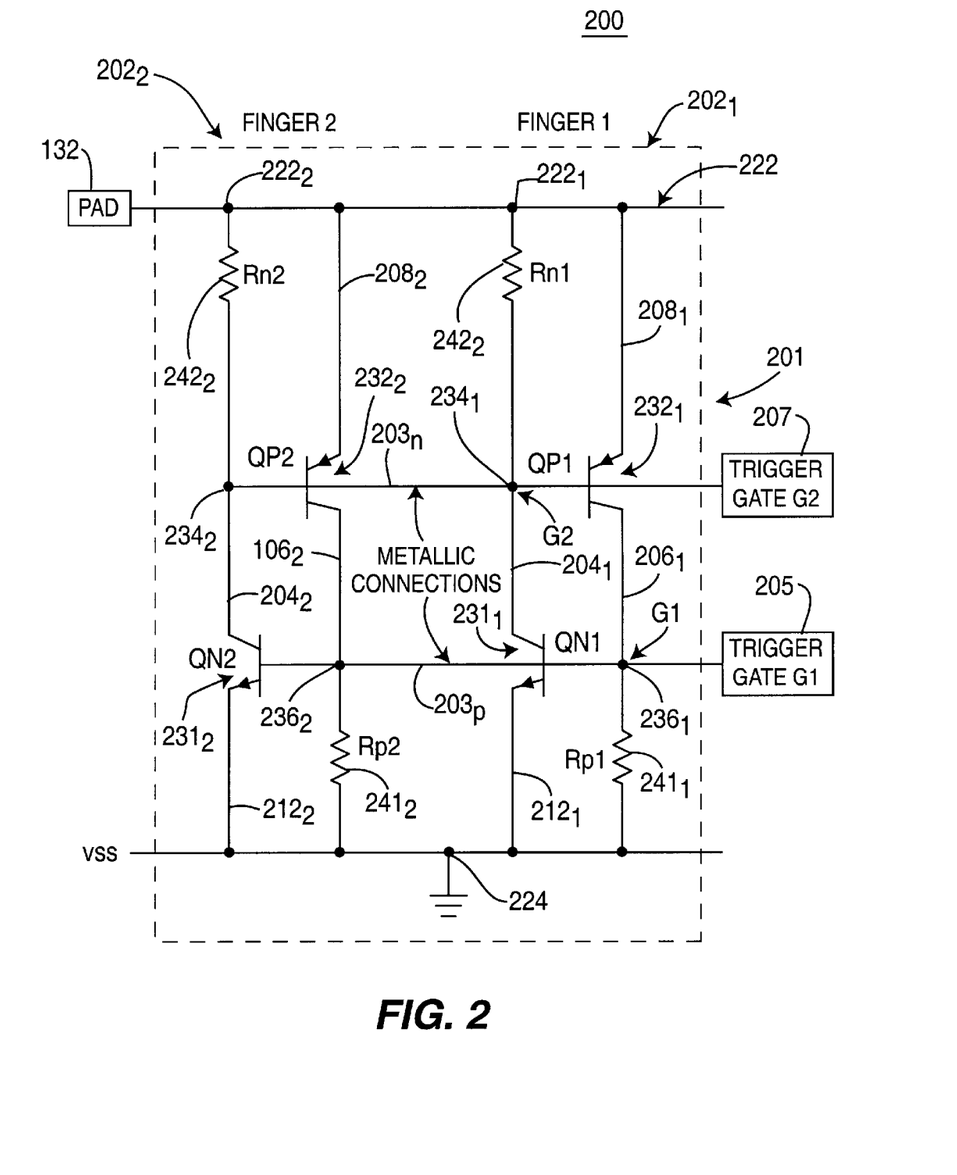
FIG. 2 depicts an illustrative schematic diagram of a multi-fingered SCR ESD protection device of the present invention.

FIG. 2 depicts an illustrative schematic diagram embodiment of a multi-fingered SCR ESD protection device 201 of the present invention. The embodiment depicts an integrated circuit (IC) 200 having an IC pad 132 coupled to a trigger device (not shown) and a multi-fingered SCR device 202. An optional current limiting resistor $R_L$ (not shown) may be positioned between the circuitry to be protected and the multi-fingered SCR ESD protection device 201. The triggering device, which senses the ESD voltage and provides a trigger current, and multi-fingered SCR 202 together serve as a protection device for the IC circuitry. In particular, the triggering device and multi-fingered SCR 202 protect the IC circuitry from electrostatic discharges (ESD) that may occur at the pad 132, which is coupled to the IC circuitry. When turned on, the multi-fingered SCR 202 functions as a shunt to redirect any ESD currents from the pad 132 to ground. That is, the multi-fingered SCR 202 quickly dissipates such over-voltage ESD condition.

In particular, the SCR protection circuit 201 is connected from a pad 132 to ground 124. The SCR protection circuit 201 comprises a first SCR $202_1$ (i.e., "first finger") and a second SCR $202_2$ (i.e., "second finger") (collectively SCR fingers 202). The first SCR finger $202_1$ further comprises a NPN transistor QN1 $231_1$ and a PNP transistor QP2 $232_1$. In particular, the SCR protection device 201 includes an anode 222, which is connected to the pad 132 and to one side of a resistor $R_{n1}$ $242_1$. The resistor $R_{n1}$ $242_1$ represents the intrinsic resistance of the N-well, which is seen at the base of the PNP transistor QP1 of the first SCR finger $202_1$. Additionally, the anode 222 is coupled to an emitter $208_1$ of a PNP transistor QP1 $232_1$, which is parallel to the intrinsic N-well resistance $R_{n1}$ $242_1$.

A first node $234_1$ is formed by the base of the PNP transistor QP1 $232_1$, the other side of the resistor $R_{n1}$ $242_1$, and the collector $204_1$ of the NPN transistor QN1 $231_1$. A second node $236_1$ is formed by the collector $206_1$ of the PNP transistor QP1 $232_1$, the base of the NPN transistor QN1 $231_1$, and one side of a resistor $R_{p1}$ $241_1$. The resistor $R_{p1}$ 241 represents the intrinsic resistance of the P-well, which is seen at the base of the NPN transistor QN1 of the SCR $202_1$. The other side of resistor $R_{p1}$ $241_1$ is connected to a third node 224, which is grounded and serves as the cathode. Furthermore, the emitter $212_1$ of the NPN transistor QN1 $231_1$ is also connected to the grounded third node 224.

A second SCR $202_2$ is formed exactly in the same manner as described with regard to the first SCR $202_1$. In particular, an emitter $208_2$ of a second PNP transistor QP2 $232_2$ is coupled to the anode 222, which is common to all of the multi-finger SCR's 202 and the pad 132. Furthermore, an emitter $212_2$ of a second NPN transistor QN2 $231_2$ is coupled to the cathode 224, which is common to all of the multi-finger SCR's 202 and grounded. In addition, the two fingers $202_1$ and $202_2$ of the multi-finger SCR protection circuit 201 are coupled together by a common P-substrate and shared N-well regions therein as discussed below with regard to FIGS. 3–5. Furthermore, the bases, which are each formed by a P-well of the first and second NPN transistors QN1 $231_1$ and QN2 $231_2$, are coupled via a low-ohmic (metal or poly silicon) connection $203_p$. Similarly, the bases, which are each formed by a N-well of the first and second PNP transistors QP1 $232_1$ and QP2 $232_2$, are coupled via a similar low-ohmic connection $203_n$.

A single triggering device is either connected to a first trigger gate 205 or a second trigger gate 207. The single triggering device, in conjunction with the inventive features as discussed below, is used to proficiently and reliably trigger all of the SCR fingers 202 in the ESD protection device 201.

Figure 3:
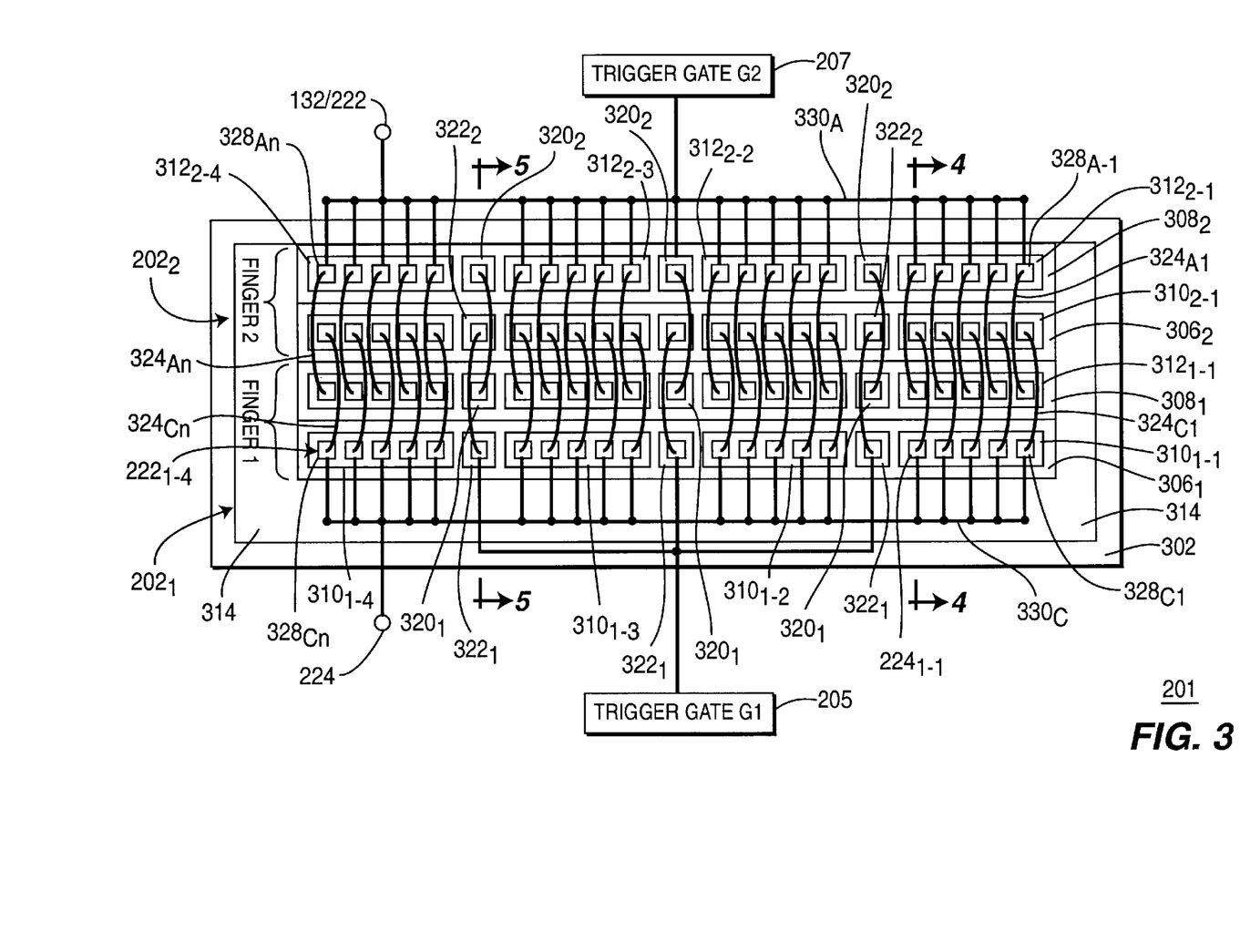
FIG. 3 depicts a top view of an embodiment of the multi-fingered SCR ESD protection device of FIG. 2.
Figure 4:
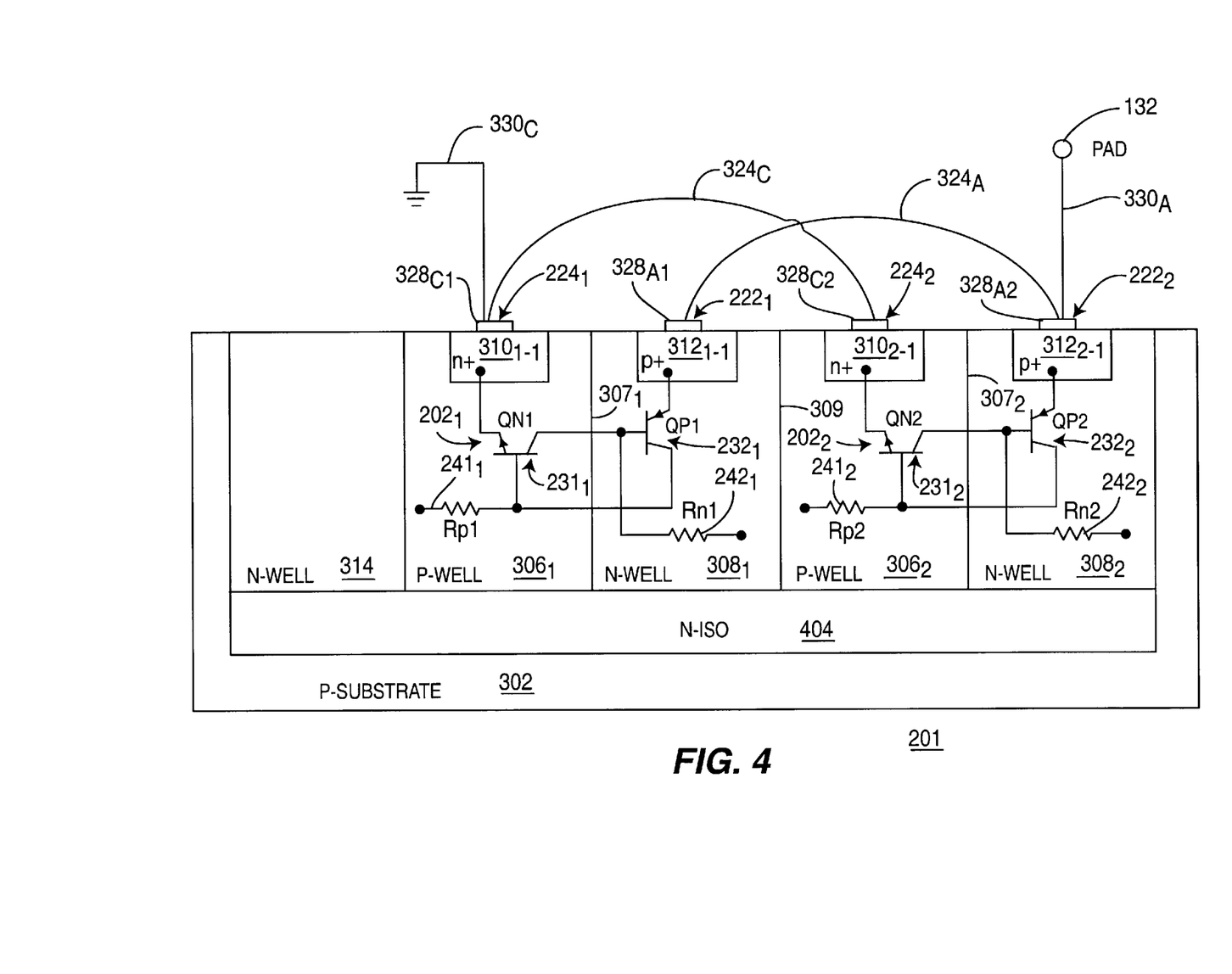
FIG. 4 depicts a cross-sectional view taken along line 4–4 of the multi-fingered SCR ESD protection device of FIG. 3.
Figure 5:
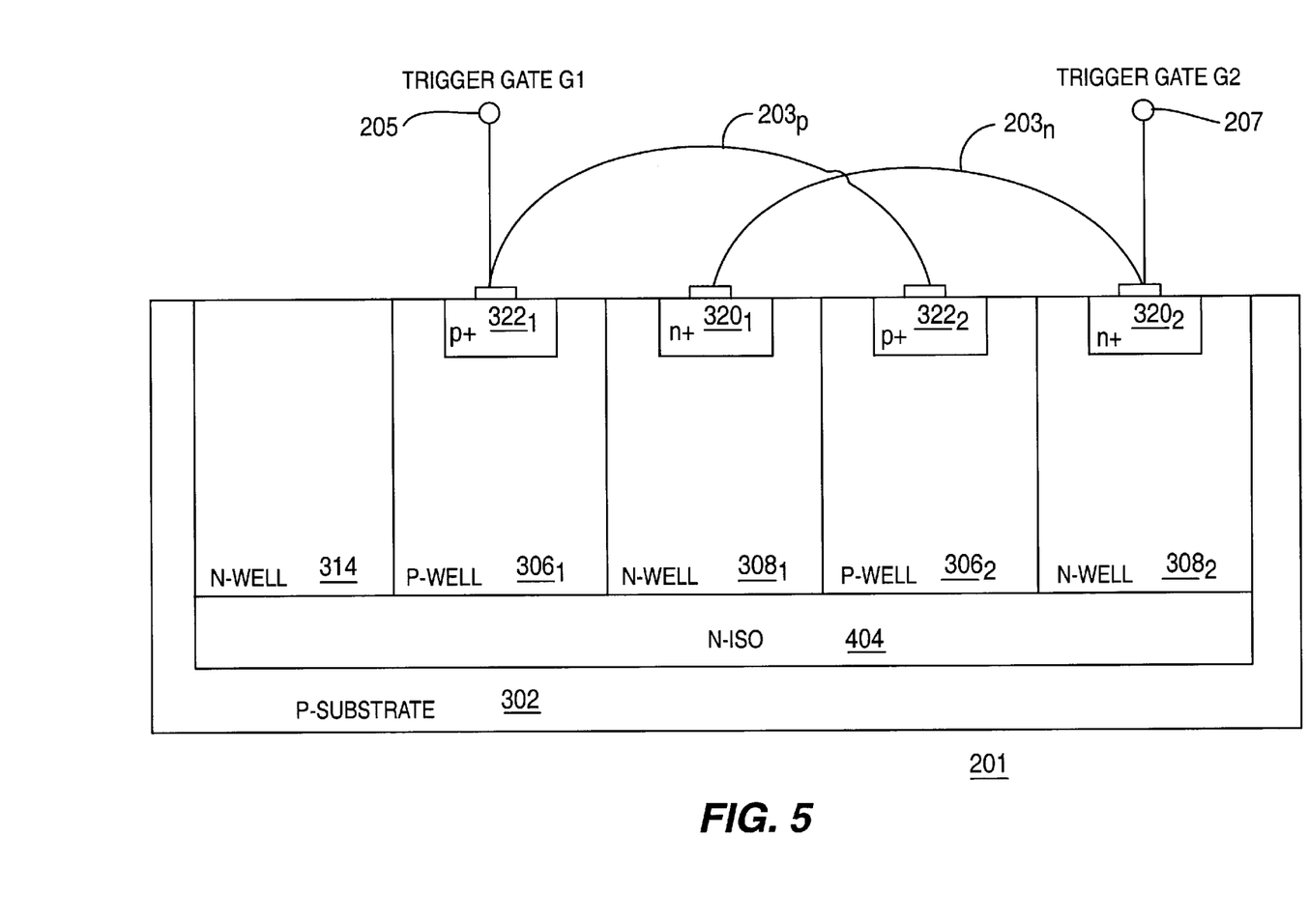
FIG. 5 depicts a cross-sectional view taken along line 5–5 of the multi-fingered SCR ESD protection device of FIG. 3.

FIG. 3 depicts a top view of an embodiment of the multi-fingered SCR ESD protection device 201, and FIG. 4 depicts a cross-sectional view of an embodiment of the multi-fingered SCR ESD protection device 201. FIGS. 3 and 4 should be viewed together. The multi-fingered SCR protection device 201 is formed on a P-substrate 302 having an optional N doped isolation layer N-ISO 404 (see FIG. 4) implanted in a portion of the P-substrate 302. Implanted in the P-substrate layer 302 (or over an optional N-ISO layer 404) are a plurality of P and N wells 306 and 308. In particular, the first SCR finger $202_1$ comprises a first P-well $306_1$ and first N-well $308_1$, which are positioned adjacent to one another to form a junction $307_1$ as shown in FIGS. 4 and 5. Additionally, the first P-well $306_1$ has a plurality of interspersed first high-doped N+ regions $310_{1\text{-}1}$ through $310_{1\text{-}4}$ implanted therein, while the first N-well $308_1$ has a plurality of interspersed first high-doped P+ regions $312_{1\text{-}1}$ through $312_{1\text{-}4}$ implanted therein.

Furthermore, where an optional N-ISO layer (see N-ISO layer 404 in FIG. 4) is implanted in the P-substrate 302 beneath the P and N wells 306 and 308, an additional N-well region 314 is provided adjacent to the sides of the P-wells 306. The additional N-well region 314 is provided to isolate the sides of the P-wells 306 from the P-substrate 302. Conversely, when the optional N-ISO layer 404 is not implanted in the P-substrate 302, the additional N-well region 314 is not required.

Likewise, the second SCR finger $202_2$ comprises a second P-well $306_2$ and second N-well $308_2$, which are also positioned adjacent to one another to form a junction $307_2$ as shown in FIGS. 4 and 5. Additionally, the second P-well $306_2$ has a plurality of interspersed second high-doped N+ regions $310_{2\text{-}1}$ through $310_{2\text{-}4}$ implanted therein, while the second N-well $308_2$ has a plurality of interspersed second high-doped P+ regions $312_{2\text{-}1}$ through $312_{2\text{-}4}$ implanted therein. It is noted that the P and N wells 306 and 308 of each SCR finger 202 are formed adjacent to each other and form a junction 309 in a similar manner as the junctions 307. For example, the N-well $308_1$ of the first SCR finger $202_1$ is positioned adjacent to the second P-well $306_2$, and so forth for each SCR finger 202 in the protective SCR device 201.

Referring to FIG. 3, the anode 222 of each SCR finger 202 comprises a plurality of contacts $328_{A1}$ through $328_{An}$, which are coupled together via external wiring $330_A$ to the pad 132. Furthermore, the anode 222 of each SCR finger 202 is coupled together via external metallic anode connections $324_{An}$. Likewise, the cathode 224 of each SCR finger 202 comprises a plurality of contacts $328_{C1}$ through $328_{Cn}$, which are coupled together via external wiring $330_C$ to ground. Furthermore, the cathode 224 of each SCR finger 202 is coupled together via external metallic cathode connections $324_{Cn}$. The external, but on-chip wiring $330_A$ and $330_C$ and metallic connections $324_{An}$ and $324_{Cn}$ are preferably fabricated by metallization processes known in the art, where each end of the wire is connected to a single contact 328.

FIG. 4 depicts a cross-sectional view taken along line 4—4 of the multi-fingered SCR ESD protection device 201 of FIG. 3. The first SCR finger $202_1$ is formed by the first P-well $306_1$ and first N-well $308_1$, having the plurality of alternating first N+ doped regions (only region $310_{1\text{-}1}$ shown) interspersed with a plurality of P+ doped regions (only region $312_{1\text{-}1}$ shown) respectively disposed therein. In particular, the plurality of first P+ doped regions $312_1$, N-well region $308_1$, and P-well region $306_1$ forms the first PNP transistor QP1 $232_1$ of the first SCR finger $202_1$. Similarly, the plurality of first N+ doped regions $310_1$, P-well region $306_1$, and N-well region $308_1$ forms the first NPN transistor QN1 $231_1$ of the first SCR finger $202_1$. The intrinsic resistance $R_{n1}$ and $R_{p1}$ of the N-well $308_1$ and P-well $306_1$ are also shown as coupled to the bases of the respective transistors QP1 $232_1$ and QN1 $231_1$. Typically, the intrinsic resistances $R_{n1}$ and $R_{p1}$ are in the range of 100 to 2000 Ohms.

Likewise, the second SCR finger $202_2$ is formed by the second P-well $306_2$ and second N-well $308_2$ respectively having the plurality of second N+ doped regions $310_{2\text{-}1}$ through $310_{2\text{-}4}$ interspersed with an alternating plurality of second P+ doped regions $312_{2\text{-}1}$ through $312_{2\text{-}4}$ disposed therein. In particular, the plurality of second P+ regions $312_2$, N-well region $308_2$, and P-well region $306_2$ form the second PNP transistor QP2 $232_2$ of the second SCR finger $202_2$. Similarly, the plurality of second N+ regions $310_2$, P-well region $306_2$, and N-well region $308_2$ form the second NPN transistor QN2 $231_2$ of the second SCR finger $202_2$. The intrinsic resistance $R_{n2}$ and $R_{p2}$ of the N-well $308_2$ and P-well $306_2$ are also shown as coupled to the bases of the respective transistors QP2 $232_2$ and QN2 $231_2$. Typically, the intrinsic resistances $R_{n2}$ and $R_{p2}$ are in the range of 100 to 2000 Ohms. The metallic connections $324_{An}$ and $324_{Cn}$ externally connect the anodes 222 and cathodes 224 of the first and second SCR fingers $202_1$ and $202_2$ together.

The anode 222 and cathode 224 of each SCR finger are formed by the interspersed high-doped P+ and N+ regions 312 and 310 respectively disposed in the N-well 308 and P-well 306. For example, the second SCR finger $202_2$ in FIG. 3 depicts four P+ regions $312_{2\text{-}1}$ through $312_{2\text{-}4}$, which collectively form the anode $222_2$. The four P+ regions $312_{2\text{-}1}$ through $312_{2\text{-}4}$ are disposed in line in the N-well $308_2$ and have 5 exemplary contacts 328 thereon. Similarly, four N+ regions $310_{2\text{-}1}$ through $310_{2\text{-}4}$ collectively form the cathode $224_2$. The four N+ regions $310_{2\text{-}1}$ through $310_{2\text{-}4}$ are disposed in line in the P-well $306_2$ and have 5 exemplary contacts 328 thereon. The same interspersed anode 222 and cathode 224 structures are provided for all of the SCR fingers 202 in the ESD protection device 201. Although, the P+ anode 222 and N+ cathode 224 are illustratively shown in FIG. 3 as having four regions and each region with 5 contacts, one skilled in the art will understand that the number of regions and contacts is not considered as limiting.

Disposed between each P+ region $312_{2\text{-}1}$ through $312_{2\text{-}4}$ and N+ region $310_{2\text{-}1}$ through $310_{2\text{-}4}$ are smaller interspersed high-doped N+ and P+ regions (hereinafter called trigger taps 320 and 322). Recall, that a single trigger gate 205 or 207 is used and is coupled to either the base of the NPN transistor QN1 $231_1$ (in the case of gate G1 205) or the base of the PNP transistor QP1 $232_1$ (in the case of gate G2 207). In the illustrative embodiment of FIG. 3, three P+ trigger tap regions $322_2$ are disposed between the four N+ regions $310_{2\text{-}1}$ through $310_{2\text{-}4}$ in the P-wells $306_1$ and $306_2$. The three trigger P+ tap regions 322 correspond to the NPN transistor QN1 $231_1$ and are being coupled to a trigger device connected at the first trigger gate G1 205 of FIG. 2.

Similarly, three N+ trigger tap regions $320_2$ are disposed between the four P+ anode regions $312_{2\text{-}1}$ through $312_{2\text{-}4}$ in the N-wells $308_1$ and $308_2$. These N+ and P+ trigger taps 320 and 322 respectively form low ohmic connections to and between the N-wells $308_{1\text{-}2}$ as well as to and between the P-wells $306_{1\text{-}2}$. The three N+ trigger tap regions 320 correspond to the PNP transistor QP1 $232_1$ and are coupled to a trigger device connected at the second trigger gate G2 207 of FIG. 2. That is, the P+ and N+ trigger taps 322 and 320 serve as first and second SCR trigger gates G1 and G2 205 and 207. The trigger taps 322 and 320 may be alternatively or both used to inject a hole current (at gate G1 205) or an electron current (at gate G2 207) to trigger the SCR.

It is also noted that where the optional N-ISO layer 404 is implanted in the P-substrate 302, the additional N-well 314 is required adjacent to the P-wells 306. For example, the additional N-well 314 is implanted adjacent to the first P-well $306_1$ as shown in FIG. 4, as well as at the ends of the in-line P-wells $306_1$ and $306_2$, thereby completely isolating the P-wells 306 from the P-substrate 302.

FIG. 5 depicts a cross-sectional view taken along line 5–5B of the multi-fingered SCR ESD protection device of FIG. 3. FIG. 5 should be viewed along with FIG. 3. In particular, the cross-sectional view shows the first P+ trigger tap (i.e., SCR trigger gate G1) $322_1$ disposed in the first P-well $306_1$ and the first N+ trigger tap (i.e., SCR gate G2) $320_1$ disposed in the first N-well $308_1$ of the first SCR finger $202_1$. Likewise, the second P+ trigger tap $322_2$ is disposed in the second P-well $306_2$, while the second N+ trigger tap $320_2$ is disposed in the second N-well $308_2$ of the second SCR finger $202_2$. An external, but on-chip P-well low-ohmic connector $203_p$ connects the first P+ trigger $322_1$ of the first SCR finger $202_1$ to the second P+ trigger tap $322_2$ of the second SCR finger $202_2$. Similarly, an external, but on-chip N-well low-ohmic connector $203_n$ connects the first N+ trigger $320_1$ of the first SCR finger $202_1$ to the second N+ trigger $320_2$ of the second SCR finger $202_2$. The P and N-well low-ohmic connections $203_p$ and $203_n$ are preferably fabricated from metal (typically aluminum or copper) or poly silicon (e.g., silicided poly silicon) or any other material available in the IC processing technology having a high electrical conductivity. Each end of the P and N-well metallic connections $203_p$ and $203_n$ is connected to a single contact 328 disposed over the P+ and N+ trigger taps 322 and 320.

FIG. 2 depicts the schematic representation of the low-ohmic connections $203_n$ and $203_p$ between PNP transistors QP1 $232_1$ and QP2 $232_2$, and between NPN transistors QN1 $231_1$ and QN2 $231_2$, respectively. As such, a single trigger device (e.g., an NMOS device, not shown) is coupled to each P-well 306 of each SCR finger 202 via the low-ohmic connectors $203_p$ (see also, FIG. 5). That is, a trigger current is injected into each P+ trigger tap $322_1$ and $322_2$ in the P-wells $306_1$ and $306_2$ via the interspersed connectors $203_n$ and $203_p$. It is noted that in the configuration as shown in FIG. 2, a ESD overvoltage condition causes the trigger device (not shown) to provide a positive trigger current at the trigger gate 205 and as such to the base of all NPN transistors QN 231 which turns on the NPN transistor QN 231. Subsequently, the PNP transistors QP 232 of each SCR finger 202 turn on. Accordingly, only the first trigger gate G1 of the SCR finger 202 is used for triggering. As such, the N+ trigger taps 320 (i.e., second SCR gates G2) are not used for injecting the initial trigger current for triggering the SCR fingers 202. However, the low-ohmic connections $203_n$ between the N+ trigger taps 320 closely link the base regions of the PNP transistors QP1 together. As such the connections $203_n$ and the N+ trigger taps 320 promote propagating the triggering to all of the SCR fingers 202. This is similar to the injection of the initial trigger current at the first trigger gate G1 205. The current flow in all the SCR fingers $202_1$ and $202_2$ is increased, thereby providing quicker turn-on time for the entire multi-fingered SCR device 201.

In a second embodiment, the trigger gate G2 207 is utilized. For example, a PMOS device (not shown) is coupled to the N+ trigger taps 320 of each SCR finger 202. It is noted that in this second embodiment, a negative current is provided from the trigger device the trigger gate G2 207. This trigger current causes the PNP transistors QP 232 to turn on, which subsequently turns on the NPN transistors QN 231 of each SCR finger 202. When the trigger gate G2 207 is utilized, the trigger current is alternately coupled to the N+ trigger taps 320, instead of the P+ trigger taps 322 for the trigger gate G1 205. Accordingly, only the second gate G2 207 of the SCR finger 202 is used for triggering. As such, the N+ trigger taps 322 (i.e., the first SCR gates G1) are not used for injecting the initial trigger current for triggering the SCR fingers 202. However, the low-ohmic connections $203_p$ between the P+ trigger taps 322 closely link the base regions of the NPN transistors QN together. As such the connections $203_p$ and the P+ trigger taps 322 promote propagating the triggering to all of the SCR fingers 202. This is similar as the injection of the initial trigger current at trigger gate G2 207. The current flow in all the SCR fingers $202_1$ and $202_2$ is increased thereby providing quicker turn-on time for the entire multi-fingered SCR device 201.

The inventive embodiment differs from the prior art of FIG. 1, since there is a direct coupling of the triggering voltage to the bases of, illustratively, each NPN transistor 231, for example, transistors QN1 and QN2 $231_1$ and $231_2$. Additionally, the inventive embodiment provides direct coupling of the PNP transistors of each SCR finger 202 (e.g., QP1 and QP2 $232_1$ and $232_2$). In this manner, the inventive embodiment differs over the prior art because the direct coupling of the P and N well regions 306 and 308 between each SCR finger 202 ensures that if the potential in one well rises (i.e., the P-well 306) or falls (e.g., the N-well 308) from triggering a first SCR finger (e.g., first SCR finger $202_1$), then the other SCR fingers $202_n$ will also trigger. As such, the SCR fingers 202 may carry large ESD current without any significant voltage differences, which could lead to non-uniform current distribution and premature failure.

It is further noted that the N-ISO layer 404 is optionally provided to isolate the P-wells 306 from the P-substrate 302. Isolating the P-wells 306 from the P-substrate 302 is beneficial because the P-wells 306 may be tied to the same voltage potentials via the connections 203, while being different from the substrate potential normally tied to ground. It is also noted that it is beneficial to use only one trigger device to ensure a well-defined trigger point.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection circuit, comprising:
   a silicon controlled rectifier having a plurality of SCR fingers, where each SCR finger comprises:
      at least one interspersed high-doped first region formed within a first lightly doped region;
      at least one interspersed high-doped second region formed within a second lightly doped region, where the first and second lightly doped regions are adjacent one another;
      at least one first trigger-tap connected to the second lightly doped region for supplying a trigger current to said SCR finger; and
      at least one first low-ohmic connection respectively coupled between the at least one first trigger tap of each SCR finger.

2. The circuit of claim 1, further comprising a bond pad, coupled to the at least one high-doped first region of each SCR finger and to protected circuitry.

3. The circuit of claim 1, further comprising:
   at least one second trigger-tap coupled to the first lightly doped region of each SCR finger, and
   at least one second low-ohmic connection respectively coupled between the at least one second trigger tap of each SCR finger.

4. The circuit of claim 1, wherein each high-doped first region of each SCR finger is respectively electrically coupled together via a plurality of first region metallic connections, where a common voltage potential across each high-doped first region of each SCR finger is provided.

5. The circuit of claim 1, wherein each high-doped second region of each SCR finger is respectively electrically coupled together via a plurality of second region metallic connections, where a common ground potential across each high-doped second region of each SCR finger is provided.

6. The circuit of claim 1, wherein each at least one first trigger-tap forms a first trigger gate G1 of each SCR finger.

7. The circuit of claim 6, wherein each at least one second trigger-tap forms a second trigger gate G2 of each SCR finger.

8. The circuit of claim 1, wherein:
   the at least one interspersed high-doped first region comprises P doped semiconductor materials;
   the at least one interspersed high-doped second region comprises N doped semiconductor materials;
   the first lightly doped region comprises N doped semiconductor material;
   the second lightly doped region comprises P doped semiconductor material; and
   the at least one first trigger-tap comprises P doped semiconductor material.

9. The circuit of claim 8, wherein the at least one second trigger-tap comprises N semiconductor material.

10. An electrostatic discharge (ESD) protection circuit, comprising:
    a silicon controlled rectifier having a plurality of SCR fingers, where each SCR finger comprises:
       at least one interspersed high-doped first region formed within a first lightly doped region;
       at least one interspersed high-doped second region formed within a second lightly doped region, where the first and second lightly doped regions are adjacent one another;
       at least one first trigger-tap connected to the second lightly doped region for supplying a trigger current to said SCR finger; and
       at least one first low-ohmic connection respectively coupled between the at least one first trigger tap of each SCR finger.

11. The circuit of claim 10, further comprising a bond pad coupled to the at least one high-doped second region of each SCR finger and to protected circuitry.

12. The circuit of claim 10, wherein each high-doped first region of each SCR finger is respectively electrically coupled together via a plurality of first region metallic connections, where a common ground potential across each high-doped first region of each SCR finger is provided.

13. The circuit of claim 10, wherein each high-doped second region of each SCR finger is respectively electrically coupled together via a plurality of second region metallic connections, where a common voltage potential across each high-doped second region of each SCR finger is provided.

14. The circuit of claim 10, wherein each at least one first trigger tap forms a first trigger gate G2 of each SCR finger.

15. The circuit of claim 10, wherein:
    the at least one interspersed high-doped first region comprises N doped semiconductor materials;
    the at least one interspersed high-doped second region comprises P doped semiconductor materials;
    the first lightly doped region comprises P doped semiconductor material;
    the second lightly doped region comprises N doped semiconductor material; and
    the at least one first trigger-tap comprises N doped semiconductor material.

16. An electrostatic discharge (ESD) protection circuit, comprising:
    a silicon controlled rectifier having a plurality of SCR fingers, each SCR finger including at least one trigger tap connected to each SCR finger for supplying a trigger current to each SCR finger; and
    at least one low-ohmic connection electrically coupling the at least one trigger tap of each SCR finger to a common triggering voltage potential.

17. An electrostatic discharge (ESD) protection circuit, comprising:
    a plurality of SCR fingers, wherein each SCR finger comprises:
       a N-well and adjacent P-well formed in a semiconductor substrate and defining a junction therebetween;
       S Ni+ doped regions interspersed in said P-well, where S is an integer greater than zero;
       T P+ doped regions interspersed in said N-well, where T is an integer greater than zero;
       U P+ doped trigger taps disposed proximate and between the S interspersed N+ doped regions in said P-well, where U is an integer greater than zero, for supplying a trigger current to the SCR finger;

at least one P-well low-ohmic connection electrically coupling the U P+ doped trigger taps of each SCR finger to a common first triggering voltage potential.

18. The circuit of claim 17, further comprising:

W N+ doped trigger-taps disposed proximate to the T interspersed P+ doped regions in said N-well, where W is an integer; and at least one N-well low-ohmic connection electrically coupling the W N+ doped trigger taps of each SCR finger to a common second voltage potential.

19. The circuit of claim 17, wherein each interspersed P+ doped region of each SCR finger is respectively electrically coupled together via a first plurality of metallic connections, where a common voltage potential across each interspersed P+ doped region of each SCR finger is provided.

20. The circuit of claim 17, wherein each interspersed N+ doped region of each SCR finger is respectively electrically coupled together via a second plurality of metallic connections, where a common ground potential across each interspersed N+ doped region of each SCR finger is provided.

21. The circuit of claim 17, further comprising an N type isolation layer implanted in the P-substrate, beneath the N-wells and P-wells and adjacent to the P-wells, wherein the P-wells are isolated from the P-substrate.

22. An electrostatic discharge (ESD) protection circuit, comprising:

a plurality of SCR fingers, wherein each SCR finger comprises:

a N-well and adjacent P-well formed in a P-substrate and defining a junction therebetween;

S N+ doped regions interspersed in said P-well, where S is an integer greater than zero;

T P+ doped regions interspersed in said N-well, where T is an integer greater than zero;

U N+ doped trigger taps disposed proximate and between the S interspersed P+ doped regions in said N-well, where U is an integer greater than zero, for supplying trigger current to the SCR finger;

at least one N-well low-ohmic connection electrically coupling the T N+ doped trigger taps of each SCR finger to a common voltage potential.

23. The circuit of claim 22, wherein each interspersed N+ doped region of each SCR finger is respectively electrically coupled together via a first plurality of metallic connections, where a common ground potential across each interspersed N+ doped region of each SCR finger is provided.

24. The circuit of claim 23, wherein each interspersed P+ doped region of each SCR finger is respectively electrically coupled together via a second plurality of metallic connections, where a common voltage potential across each interspersed P+ doped region of each SCR finger is provided.

* * * * *

UNITED STATES PATENT AND TRADEMARK OFFICE
CERTIFICATE OF CORRECTION

PATENT NO.      : 6,621,126 B2
DATED           : September 16, 2003
INVENTOR(S)   : Christian C. Russ It is certified that error appears in the above-identified patent and that said Letters Patent is hereby corrected as shown below:

<u>Column 10,</u>
Line 60, please change "S Ni+" to -- S N+ --.

Signed and Sealed this

Twentieth Day of January, 2004

JON W. DUDAS
*Acting Director of the United States Patent and Trademark Office*